US008884402B2

(12) United States Patent
Xie et al.

(10) Patent No.: US 8,884,402 B2
(45) Date of Patent: Nov. 11, 2014

(54) CIRCUIT LAYOUT STRUCTURE

(75) Inventors: Yong-Gang Xie, Singapore (SG); Yu-Neng Cheng, Singapore (SG); Ting Song Chen, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 535 days.

(21) Appl. No.: 12/769,615

(22) Filed: Apr. 28, 2010

(65) Prior Publication Data

US 2011/0266032 A1 Nov. 3, 2011

(51) Int. Cl.
*H01L 23/544* (2006.01)
*H01L 21/768* (2006.01)
*H01L 21/00* (2006.01)
*H01L 23/58* (2006.01)
*H01L 23/522* (2006.01)
*H01L 23/532* (2006.01)

(52) U.S. Cl.
CPC .......... *H01L 21/00* (2013.01); *H01L 21/76802* (2013.01); *H01L 23/522* (2013.01); *H01L 23/5329* (2013.01); *H01L 23/585* (2013.01)
USPC .................. 257/620; 257/797; 257/E23.179

(58) Field of Classification Search
USPC .......... 257/283, 774, 797, E23.001, E23.145, 257/E23.179, E21.434, E24.444, E21.453, 257/E29.01, E23.142, 620, E21.523, 257/E21.524, E21.596, E21.214, E21.237, 257/E21.238, E21.483; 438/401, 462, 570, 438/975, 629, 637, 639, 640, 667, 668, 672, 438/675, 700, 701, 703, 978
See application file for complete search history.

(56) References Cited

U.S. PATENT DOCUMENTS

| 5,614,445 | A | 3/1997 | Hirabayashi | |
|---|---|---|---|---|
| 6,214,703 | B1 * | 4/2001 | Chen et al. | 438/462 |
| 6,599,665 | B1 | 7/2003 | Lin | |
| 6,841,880 | B2 | 1/2005 | Matsumoto | |
| 6,879,025 | B2 * | 4/2005 | Sasaki et al. | 257/620 |
| 7,507,634 | B2 * | 3/2009 | Sato et al. | 438/422 |
| 2004/0121577 | A1 * | 6/2004 | Yu et al. | 438/622 |
| 2008/0070381 | A1 * | 3/2008 | Onuma | 438/462 |
| 2008/0283970 | A1 * | 11/2008 | Uchiyama et al. | 257/620 |
| 2009/0134496 | A1 * | 5/2009 | Warrick et al. | 257/620 |

FOREIGN PATENT DOCUMENTS

EP 1032025 A2 8/2000

* cited by examiner

*Primary Examiner* — Cuong Q Nguyen
*Assistant Examiner* — Yosef Gebreyesus
(74) *Attorney, Agent, or Firm* — Winston Hsu; Scott Margo

(57) ABSTRACT

A circuit layout structure includes a wafer having at least a cell region and a scribe line region defined thereon, a metal pattern formed in a first insulating layer in the scribe line region, a second insulating layer and a hard mask layer formed on the metal pattern and the first insulating layer, and at least a dummy pattern formed in the second insulating layer and the hard mask layer in the scribe line region. The dummy pattern has a transmission rate between 0% and 1%.

13 Claims, 6 Drawing Sheets

CIRCUIT LAYOUT STRUCTURE

BACKGROUND OF THE INVENTION

1. Field of the Invention

The present invention relates generally to a circuit layout structure, more particularly, to a circuit layout structure that is able to reduce undesired capacitance charging effect.

2. Description of the Prior Art

In the semiconductor manufacturing process, the semiconductor devices, such as the transistors, are formed by multilayer process and electrically connected by wirings, which are done through multilayer metallization on top of the multilayered semiconductor devices. And during those multilayer processes, photolithography and etching processes are conventionally employed to construct the predetermined pattern in a certain layer.

Please refer to FIGS. 1-2, which are schematic drawings illustrating the conventional steps for forming a pre-determined pattern in a certain layer in the prior art. As shown in FIG. 1, a wafer 100 is provided, the wafer 100 includes a silicon substrate 110 having multilayered semiconductor devices (not shown) constructed therein. An interlayer dielectric (ILD) layer 120 is formed on the silicon substrate 110 and at least a metal contact plug 122 is formed in the ILD layer 120. It is noteworthy that during forming the metal contact plug 122, alignment marks and advanced imaging metrology (AIM) overlay marks are always needed to ensure the contact plug pattern (not shown) match up the feature designed in the lower layer, and thus the contact plug 122 formed later is able to provide interconnection successfully and satisfactorily. Therefore, a conductive alignment mark or an AIM mark 124 is left in the ILD layer 120 in a scribe line region 114, while the contact plug 122 is formed in a cell region 112.

Please refer to FIG. 1 again. Then, an inter-metal dielectric (IMD) layer 130 is disposed on and covers the contact plug 122, the conductive alignment/AIM mark 124 and the ILD layer 120. In the prior art, the IMD layer 130 can include silicon oxynitride, tetraethoxysilane-based oxide (TEOS) and/or a low-k material . . . etc. Next, a patterned hard mask 140 is formed on the IMD layer 130. The patterned hard mask 140 comprises predetermined patterns 142, such as trench patterns. Conventionally, the patterned hard mask 140 can be a metal hard mask includes titanium nitride (TiN).

Please refer to FIG. 2. Next, a suitable etchant 150 under a plasma circumstance is used to etch the underlying IMD layer 130 to transfer the predetermined pattern 142 into the IMD layer 130. Thus trench openings 132 for defining metal wires are formed and the contact plug 122 is exposed in bottom of the trench openings 132. However, it is found that not all of the trench openings 132 may successfully expose the contact plug 122 in the ILD layer 120 as expected, as shown in FIG. 2. One reason for this undesired etching result is that since the ILD layer 130, which includes dielectric material, is positioned between the two conductive elements: the conductive alignment/AIM marks 124 and the metal hard mask 140, an adverse capacitance is always generated between the metal hard mask 140 and the conductive alignment/AIM mark 124 in the scribe line region 114 during the etching step. As a result, the capacitance attracts more charged etching residues 152 to accumulate in the trench openings 132 in the cell region 112 and to block the sidewalls and the bottom of the trench openings 142, so that the result of etching the ILD layer 130 cannot be completed as desired. Accordingly, effective electrical interconnection is not constructed.

Therefore, a novel circuit layout structure is still in need to improve the yield of the etching step, in particular to avoid the accumulation of the etching residues in the predetermined openings and the failure to expose the underlying designed features.

SUMMARY OF THE INVENTION

According to an aspect of the present invention, there is provided a circuit layout structure comprising a wafer having at least a cell region and a scribe line region defined thereon, a metal pattern formed in a first insulating layer in the scribe line region, a second insulating layer and a hard mask layer formed on the metal pattern and the first insulating layer, and at least a dummy pattern formed in the second insulating layer and the hard mask layer in the scribe line region. The dummy pattern has a transmission rate between 0% and 1%.

According to the provided circuit layout structure, the dummy pattern is provided in the scribe line region, and thus the charged etching residues attracted by the capacitance, which is generated by the metal pattern and the hard mask layer, are accumulated in the dummy pattern during the etching process. Accordingly, the desired via pattern or the trench pattern is completely and satisfactorily formed in the cell region, and the yield of the etching step is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
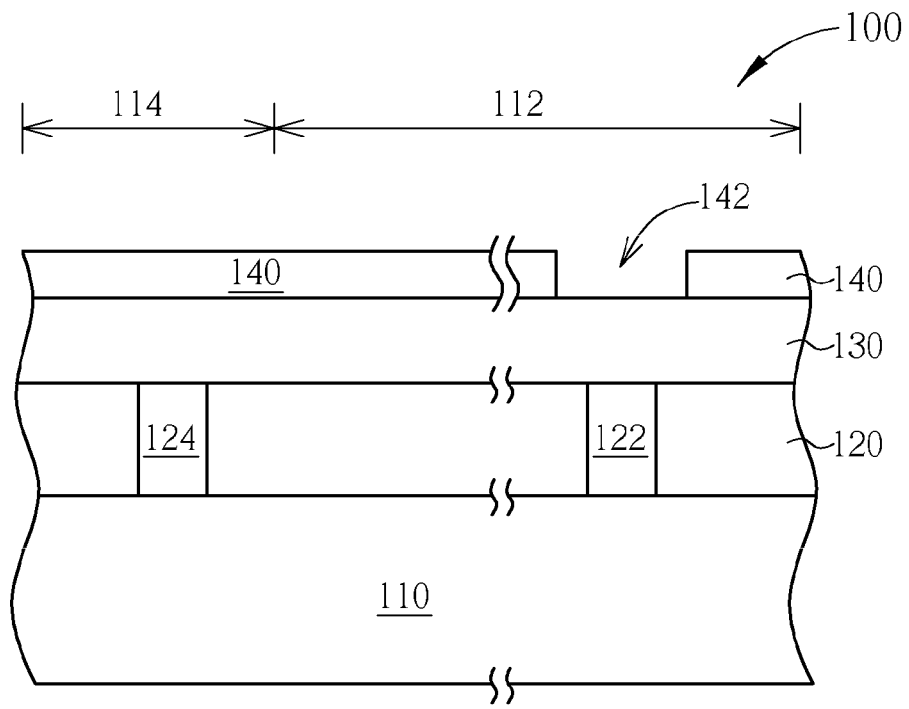
FIGS. 1-2 are schematic drawings illustrating conventional steps for forming a pre-determined pattern in a certain layer in the prior art.
Figure 2:
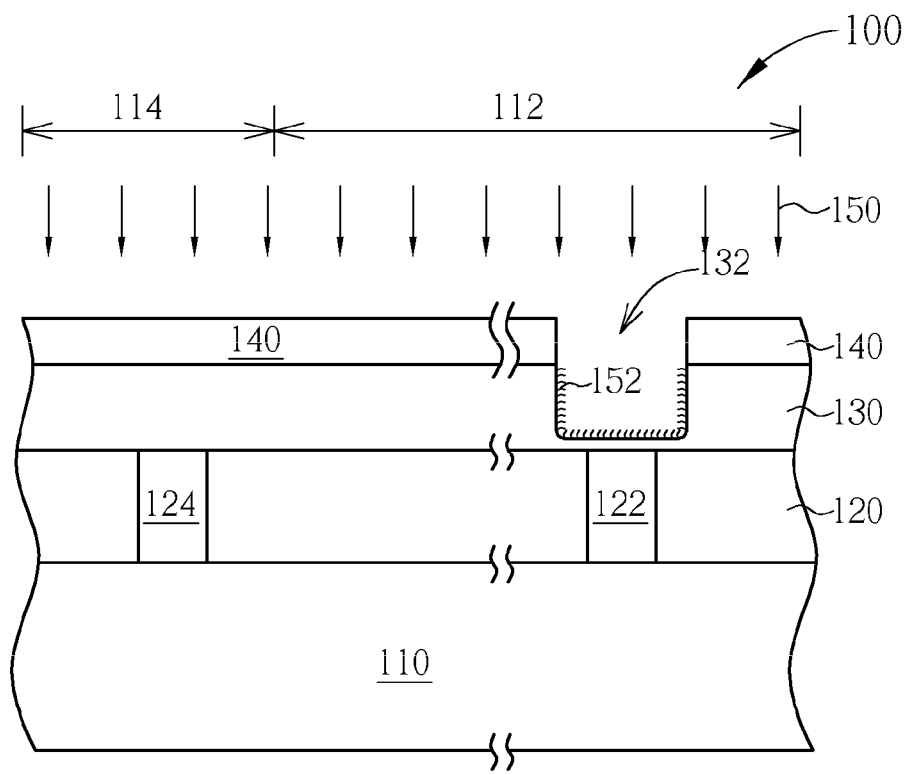
Figure 3:
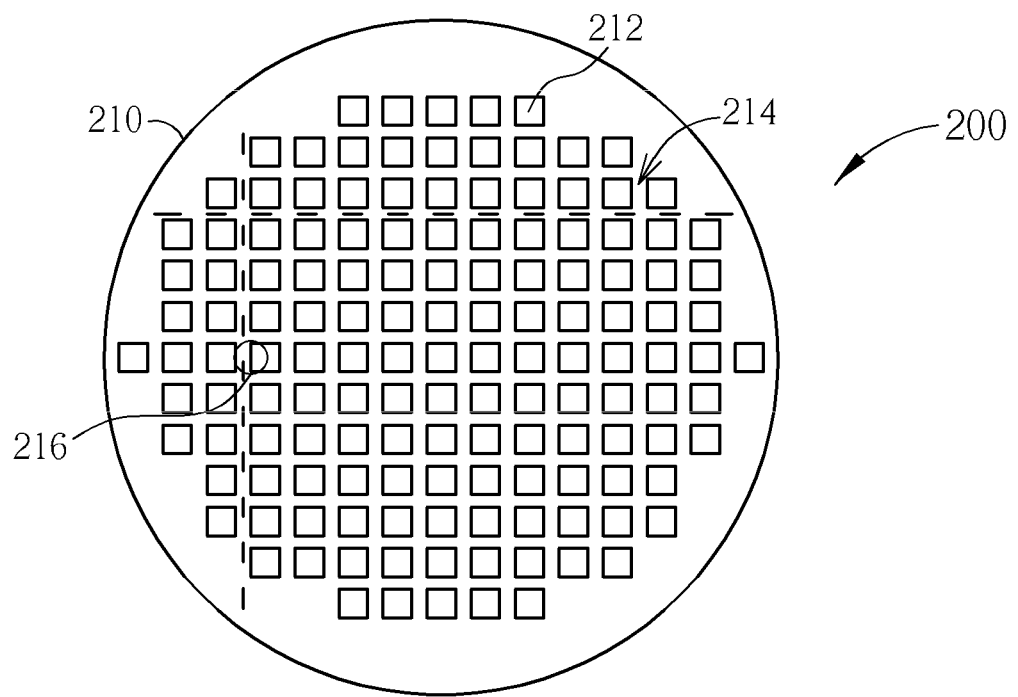
FIGS. 3-6 are schematic drawings illustrating a circuit layout structure provided by a first preferred embodiment of the present invention.

Please refer to FIGS. 3-6, which are schematic drawings illustrating a circuit layout structure provided by a first preferred embodiment of the present invention. Please refer to FIG. 3, which is a top view of a wafer provided by the preferred embodiment. As shown in FIG. 3 the circuit layout structure 200 provided by the present invention includes a wafer 210, and the wafer 210 has a plurality of cell regions 212 and a scribe line region 214 defined thereon.

Figure 4:
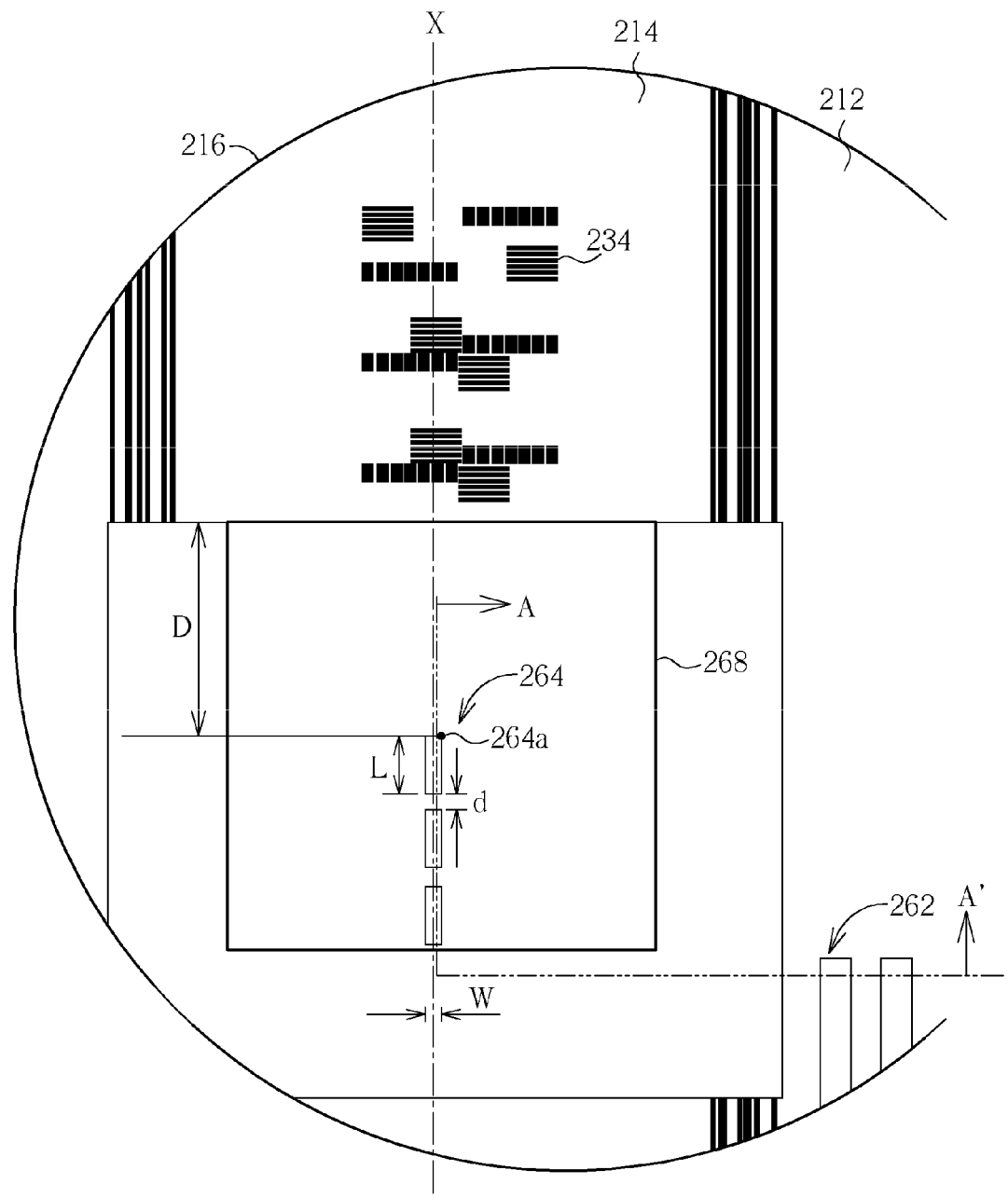
Figure 5:
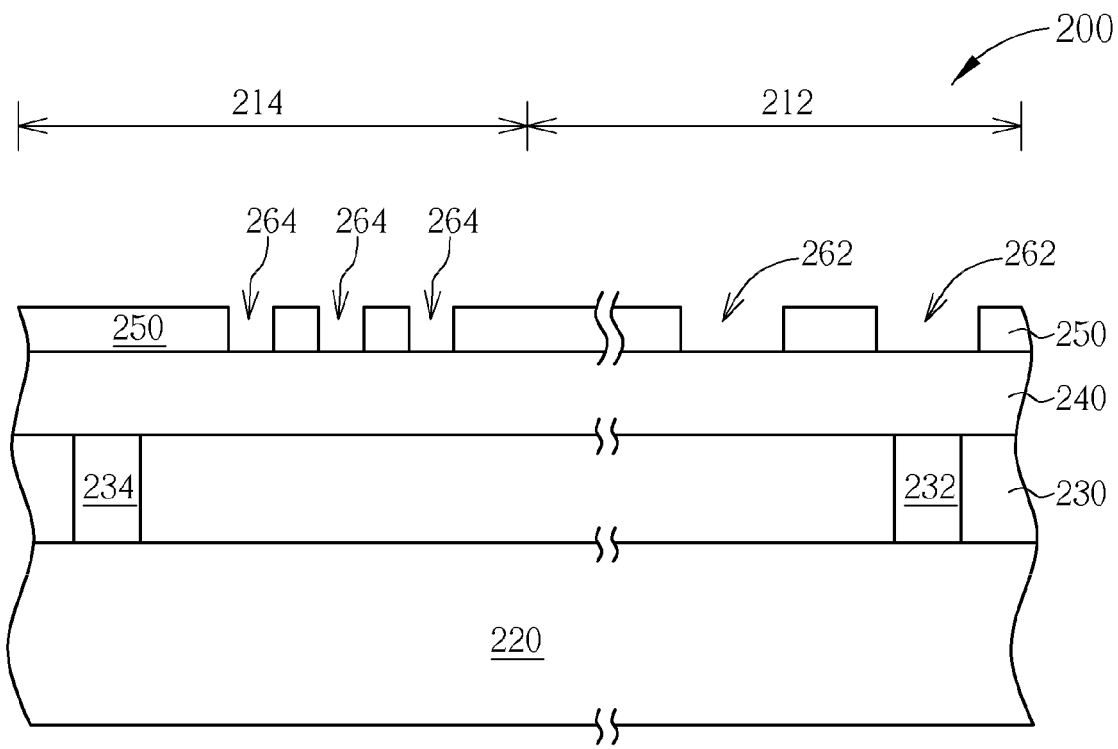
Figure 6:
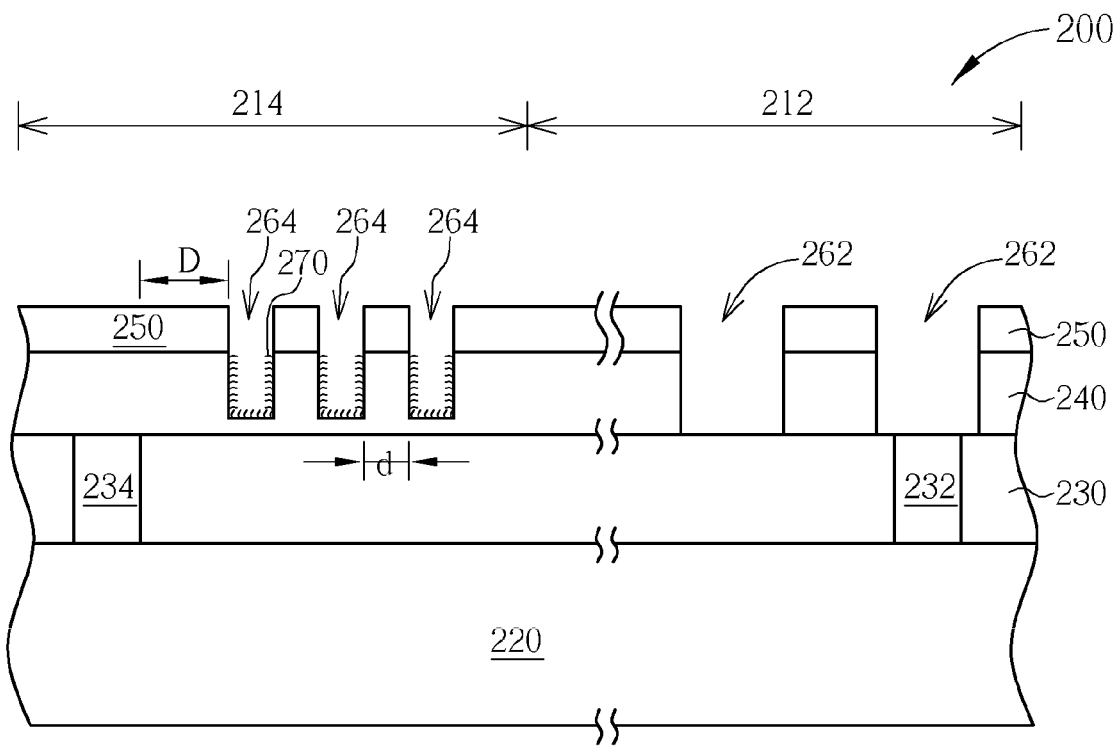

Please refer to FIG. 4, which is an enlarged view of a portion of the scribe region 214 and a portion of the cell region 212 of the wafer 210 as designated by the circle 216 shown in FIG. 3, and FIGS. 5-6 are cross-sectional views taken along a crossing line A-A' in FIG. 4. As shown in FIG. 4 and FIG. 5, the wafer 210 includes a semiconductor substrate 220 having above mentioned semiconductor devices (not shown) constructed in the cell region 212 in the semiconductor substrate 220 and a first insulating layer 230 formed thereon. The semiconductor devices are multilayered structure as mentioned above. The first insulating layer 230 can be an inter-layer dielectric (ILD) layer or an inter-metal dielectric (IMD) layer. In this preferred embodiment, the first insulating layer 230 is exemplarily an ILD layer.

Please refer to FIG. 4 and FIG. 5 again. The circuit layout structure 200 includes at least a connecting pattern 232, such as a contact plug, in the first insulating layer 230 in the cell region 212. The circuit layout structure 200 further includes at least a metal pattern 234 formed in the first insulating layer 230 in the scribe line region 214. It is well-known that during forming the connecting pattern 232, an alignment mark or an overlay mark is needed since the overlay control becomes more critical in semiconductor process. Therefore the metal pattern 234 comprising alignment marks or overlay marks such as Box-in-Box (BiB), Frame-in-Frame (FiF) or KLA-Tencor Advanced Imaging Metrology (AIM) marks, which are evaluated under different process conditions, is formed in the scribe line region 214.

As shown in FIG. 5, the circuit layout structure 200 further comprises a second insulating layer 240 formed on the first insulating layer 230. In the preferred embodiment, the second insulating layer 240 is exemplarily an IMD layer. The second insulating layer 240 is a low-k dielectric layer, and the low-k dielectric layer can be of organic materials, such as spin-on polymer (SOP), FLARE, SILK, PARYLENE and/or PAE-II, and formed through a spin-coating process. Alternatively, the low-k dielectric layer can be of SiO-based materials, such as $SiO_2$, TEOS, FSG or USG, and formed through a spin-coating process, or BLACK DIAMOND, CORAL, AURORA, and FLOWFILL, and formed through a chemical vapor deposition (CVD) process. Then, a hard mask layer 250 is formed on the second insulating layer 240. The hard mask layer 250 preferably comprises metal hard mask, and the metal hard mask can be of Ti, TiN, Ta, TaN, Al, or AlCu.

Please refer to FIGS. 4-6. The hard mask layer 250 is patterned by a photolithography process, thus at least a dummy pattern 264 is formed in hard mask layer 250 in the scribe line region 214 and at least a trench or a via pattern 262 is formed in the hard mask layer 250 in the cell region 212. Then, an etching process in which a suitable etchant under a plasma circumstance is used is performed to transfer the via/trench pattern 262 and the dummy pattern 264 into the second insulating layer 240 as shown in FIG. 6. It is noteworthy, that the number of the dummy patterns 264 and the trench/via patterns 262 can be adjusted to fit the needs of the process or product desired.

Please refer to FIG. 4 and FIG. 6. To make sure the dummy patterns 264 are substantially positioned in the center of the scribe line region 214, the dummy patterns 264 are arranged along an axial line X in the scribe line region 214. In other words, the distances between both margins of the scribe line region 214 and the dummy patterns 264 are equal. Furthermore, a horizontal distance "D" between the dummy pattern 264 and the metal pattern 234 can be larger than a half of the width of the scribe line region 214. For example, when a width of the scribe lines region 214 is exemplarily 50-90 μm, the horizontal distance D is exemplarily of about 50 μm in this preferred embodiment, but not limited to this.

A transmission rate is used to define a proportion of a particular pattern in a particular region on a photomask. After the photolithography process and the etching process, such pattern is transferred into an objective layer. In this preferred embodiment, the dummy patterns 264 are transferred into the second insulating layer 240 and such particular region as mentioned above is defined as a square frame 268 with a corner of the dummy pattern 268 serving as a center 264a. And a distance between the center 264a and the four sides of the square frame 268 is exemplarily 30 μm, but not limited to this. It is noteworthy that a major purpose of forming the dummy patterns 264 is to make a transmission rate at the dummy patterns 264 lower than a transmission rate at the cell region 212. Accordingly, the dummy patterns 264 have a transmission rate between 0% and 1%, preferably between 0% and 0.4%, and more preferably lower than 0.1%. It is also noteworthy the dummy pattern 264 is exemplarily a rectangle shape as shown in FIG. 4 in this preferred embodiment. However, the shape of the dummy patterns 264 is not limited to this description as long as its transmission rate is lower than 1%. As shown in FIG. 4, the dummy pattern 264 has a length "L" of about 2 μm and a width "W" between 0.2 and 2 μm, but not limited to this. In the first preferred embodiment, the dummy pattern 264 exemplarily has the length L of 2 μm and the width W of 0.2 μm. The length L of the dummy pattern 264 is parallel with the axial line X in the scribe line region 214 as show in FIG. 4. A distance "d" between each of the dummy pattern is of about 0.5 μm, but not limited to this. Additionally, the size of the dummy pattern 264 is not limited to this description as long as the transmission rate of the dummy pattern 264 is lower than that of a cell isolation pattern.

Accordingly, the charged etching residues 270 generated in the etching process performed to form the via/trench pattern 262 in the second insulating layer 240 are attracted by the capacitance caused between the hard mask layer 250, the second insulating layer 240 and the metal pattern 234 in the scribe line region 214, and are apt to accumulate in the dummy pattern 264 in the scribe line region 214 during the etching process. As shown in FIG. 6, the first insulating layer 230 is not exposed by the dummy 264 and still covered by the second insulating layer 240. In the cell region 212, the etching process is satisfactorily completed, and the formed trench/via pattern 262 with steep sidewalls is to expose the connecting pattern 232 without excess residues 270. Sequentially, the desired interconnection is to be constructed after filling the trench/via pattern 262 with metal materials.

Figure 7:
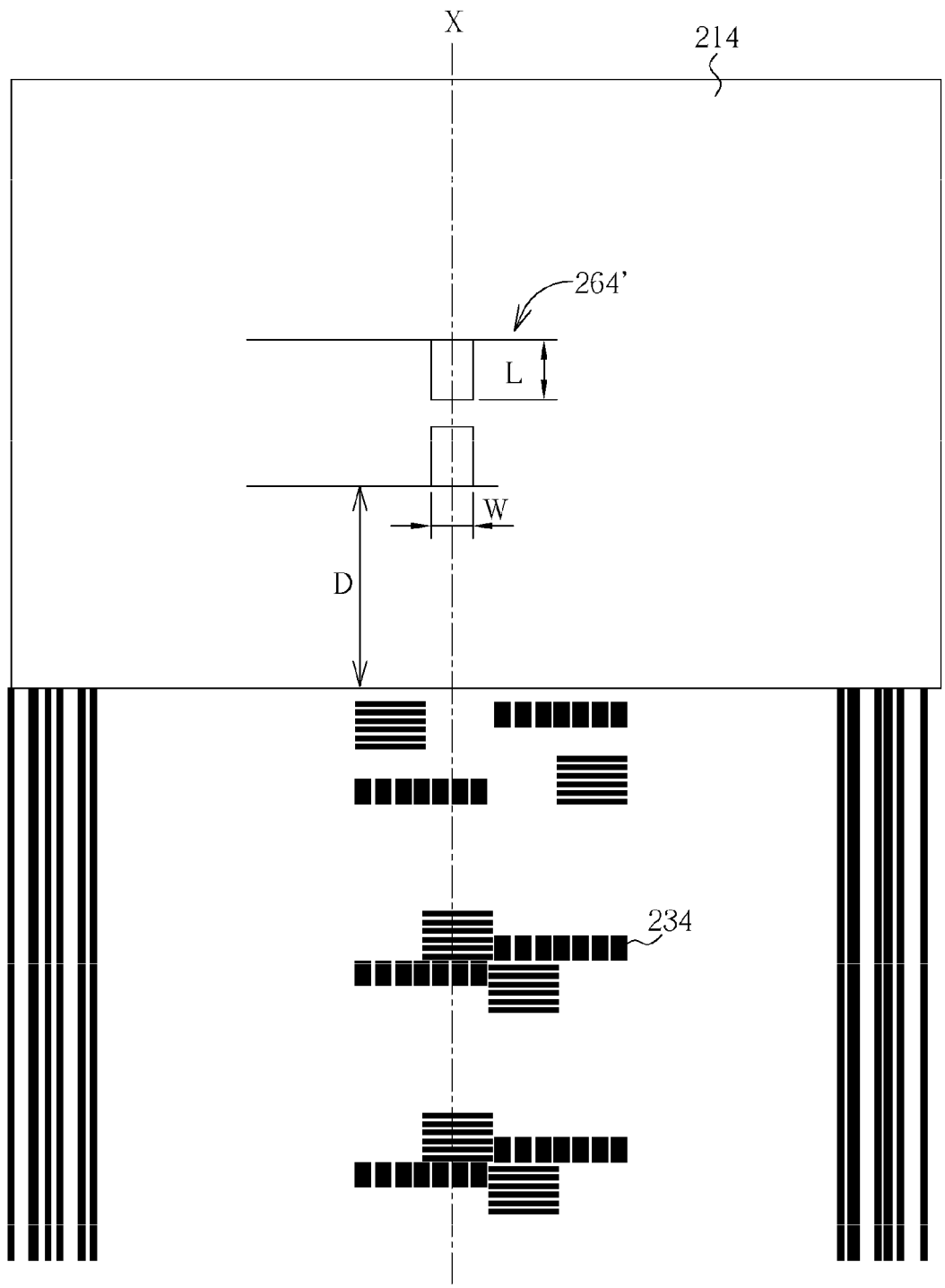
FIG. 7 is a schematic drawing illustrating a circuit layout structure provided by a second preferred embodiment of the present invention.

Please refer to FIG. 7, which is a schematic drawing illustrating a circuit layout structure provided by a second preferred embodiment of the present invention. In the second preferred embodiment, the wafer having the cell region and the scribe line region defined thereon, the first insulating layer having the metal pattern and connecting formed therein, and the second insulating layer and the metal hard mask layer having the dummy pattern and the trench/via pattern formed therein are similar with the first preferred embodiment, therefore those details are omitted in the interest of brevity. The only difference between the first and second preferred embodiment is the width W of the dummy pattern: as shown in FIG. 7, the dummy pattern 264' provided by the second preferred embodiment has a length L of about 2 μm and a width W' of 1 μm. Since the size of the dummy pattern 264' is larger than that of the dummy pattern 264 provided by the first preferred embodiment, the numbers of the dummy pattern 264' can be less than that of the dummy pattern 264.

Figure 8:
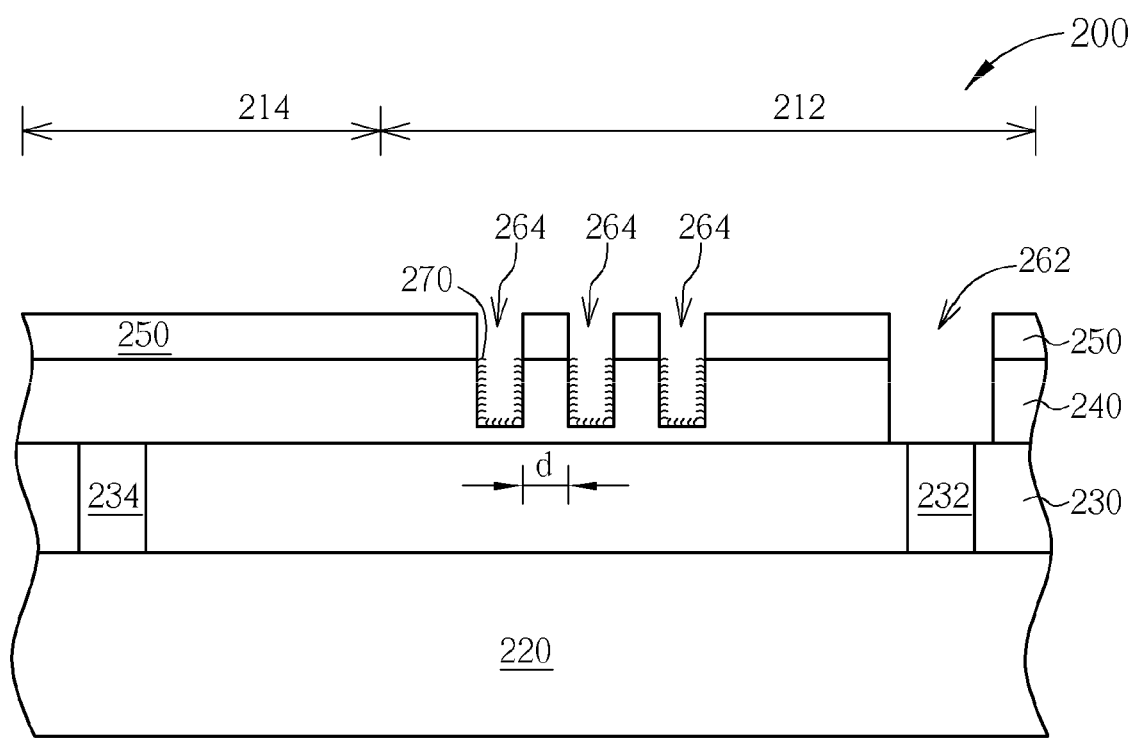
FIG. 8 is a modification provided by the present invention.

Please refer to FIG. 8, which is a modification provided by the present invention. In this modification, the dummy pattern 264 is further formed in the cell region 212, thus the charged etching residues 270 generated in the etching process performed to form the via/trench pattern 262 in the second insulating layer 240 are attracted to accumulate in the dummy pattern 264 in the cell region 212 during the etching process. Consequently, the etching process is satisfactorily completed in the cell region 212, and the formed trench/via pattern 262 with steep sidewalls is to expose the connecting pattern 232 without excess residues 270.

According to the provided circuit layout structure, the dummy pattern is provided in the scribe line region, and thus the charged etching residues attracted by the capacitance, which is generated by the metal pattern and the metal hard mask layer, are accumulated in the dummy pattern during the etching process. Accordingly, the desired via pattern or the trench pattern is completely and satisfactorily formed in the cell region, and the yield of the etching step is improved.

Those skilled in the art will readily observe that numerous modifications and alterations of the device and method may be made while retaining the teachings of the invention.

What is claimed is:

1. A circuit layout structure comprising:
   a wafer having at least a cell region and a scribe line region defined thereon;
   at least a metal pattern formed in a first insulating layer in the scribe line region;
   a second insulating layer and a hard mask layer formed on the metal pattern and the first insulating layer;
   a trench or a via pattern formed in the second insulating layer in the cell region, the trench or via pattern comprising a rectangular shape; and
   a plurality of dummy patterns formed in the second insulating layer and the hard mask layer in the scribe line region, the plurality of dummy patterns having a transmission rate between 0% and 1%, and the plurality of dummy patterns being arranged to form only one column along an axial line of the scribe line region, the plurality of dummy patterns comprising a rectangular shape, and long sides of the plurality of dummy patterns are parallel with a long side of the trench or via pattern in the plan view,
   wherein a distance between margins of the scribe line region and the plurality of dummy patterns is larger than 0.

2. The circuit layout structure of claim 1, wherein the metal pattern comprises alignment marks or overlay marks.

3. The circuit layout structure of claim 1, wherein the first insulating layer comprises an inter-layer dielectric (ILD) layer or an inter-metal dielectric (IMD) layer.

4. The circuit layout structure of claim 3, further comprising a connecting pattern formed in the first insulating layer in the cell region.

5. The circuit layout structure of claim 4, wherein the second insulating layer comprises an IMD layer.

6. The circuit layout structure of claim 4, wherein the connecting pattern in the first insulating layer is formed in the cell region and in direct contact with the via pattern, the via pattern formed in the second insulating layer is extended along the cell region.

7. The circuit layout structure of claim 1, wherein the hard mask layer comprises metal hard mask layer.

8. The circuit layout structure of claim 1, wherein a horizontal distance between the plurality of dummy pattern and the metal pattern is about 50 μm.

9. The circuit layout structure of claim 1, wherein the plurality of dummy pattern has a length of about 2 μm.

10. The circuit layout structure of claim 9, wherein the length of the plurality of dummy pattern is parallel with the axial line of the scribe line region.

11. The circuit layout structure of claim 1, wherein the plurality of dummy pattern has a width between 0.2 and 2 μm.

12. The circuit layout structure of claim 1, wherein the plurality of dummy pattern has the transmission rate preferably between 0% and 0.4%.

13. The circuit layout structure of claim 12, wherein the plurality of dummy pattern has the transmission rate more preferably between 0% and 0.1%.

* * * * *